(12) United States Patent
Beer et al.

(10) Patent No.: US 6,841,857 B2
(45) Date of Patent: Jan. 11, 2005

(54) ELECTRONIC COMPONENT HAVING A SEMICONDUCTOR CHIP, SYSTEM CARRIER, AND METHODS FOR PRODUCING THE ELECTRONIC COMPONENT AND THE SEMICONDUCTOR CHIP

(75) Inventors: Gottfried Beer, Nittendorf (DE); Robert Bergmann, Regensburg (DE); Heng Wan Jenny Hong, Singapore (SG)

(73) Assignee: Infineon Technologies AG, Munich (DE)

( * ) Notice: Subject to any disclaimer, the term of this patent is extended or adjusted under 35 U.S.C. 154(b) by 11 days.

(21) Appl. No.: 10/197,790

(22) Filed: Jul. 18, 2002

(65) Prior Publication Data

US 2003/0038346 A1 Feb. 27, 2003

(30) Foreign Application Priority Data

Jul. 18, 2001 (DE) .......................................... 101 33 845

(51) Int. Cl.[7] .............................................. H01L 23/495
(52) U.S. Cl. ....................... 257/675; 257/666; 257/706; 257/707; 257/708
(58) Field of Search .......................... 257/675, 706–712

(56) References Cited

U.S. PATENT DOCUMENTS

| 50,419 | A | * | 10/1865 | Cushing ........................ 162/72 |
| 5,345,106 | A | * | 9/1994 | Doering et al. .............. 257/675 |
| 5,661,092 | A | * | 8/1997 | Koberstein et al. .......... 427/515 |
| 5,808,359 | A | | 9/1998 | Muto et al. |
| 6,166,446 | A | * | 12/2000 | Masaki ........................ 257/796 |
| 6,249,433 | B1 | * | 6/2001 | Huang et al. ................ 361/704 |
| 6,323,549 | B1 | * | 11/2001 | deRochemont et al. ...... 257/703 |
| 6,436,550 | B2 | * | 8/2002 | Sakata et al. ................ 428/553 |
| 6,552,417 | B2 | * | 4/2003 | Combs ........................ 257/666 |

FOREIGN PATENT DOCUMENTS

EP 0164794 A2 * 5/1985

\* cited by examiner

*Primary Examiner*—Wael Fahmy
*Assistant Examiner*—Nathan W. Ha
(74) *Attorney, Agent, or Firm*—Laurence A. Greenberg; Werner H. Stemer; Ralph E. Locher

(57) ABSTRACT

An electronic component and a system carrier having a heat conduction block, on which overlapping inner flat conductor ends are fixed mechanically and insulated electrically by an organoceramic layer (6). In addition, methods of producing the system carrier and the electronic component are encompassed.

22 Claims, 7 Drawing Sheets

ELECTRONIC COMPONENT HAVING A SEMICONDUCTOR CHIP, SYSTEM CARRIER, AND METHODS FOR PRODUCING THE ELECTRONIC COMPONENT AND THE SEMICONDUCTOR CHIP

BACKGROUND OF THE INVENTION

1. Field of the Invention

The invention relates to an electronic component having a semiconductor chip, a system carrier for the assembly of electronic components and to methods of producing the system carrier and the electronic component.

2. Description of the Related Art

The document U.S. Pat. No. 5,808 359 discloses a semiconductor component which has a heat sink with outer contacts led out of a plastic housing at the corners in order to protect the outer flat conductors arranged at the housing edge. A semiconductor chip can be soldered or sintered directly onto the heat sink or adhesively bonded on with conductive adhesive. The outer contacts of the heat sink are led out at the corners of the electronic component. To provide the heat sink with outer contacts, a first system carrier is provided. Arranged physically above this first system carrier in the known semiconductor component is a second system carrier, which carries the inner and outer flat conductors arranged at the side, the inner flat conductor ends being arranged to overlap above the heat sink.

One disadvantage of this arrangement of the overlapping inner flat conductor ends is that reliable bonding to the floating inner flat conductor ends is difficult. Furthermore, a disadvantage of the known semiconductor component is that the cooling action of the overlapping inner flat conductor ends is extremely limited.

In the electronic component disclosed by U.S. Pat. No. 5,808,359, complicated outer contacts for the heat sink are additionally provided in the corner regions, in order to be able to carry heat to the heat sink from outside for commissioning operations. Furthermore, for the assembly of the known semiconductor component, a relatively complex system of two system carriers is required, namely a system carrier for the retention and arrangement of the heat sink and a further system carrier, which increases the assembly costs and complicates the housing technology for such a semiconductor component disclosed by the prior art.

SUMMARY OF THE INVENTION

It is an object of the invention to overcome the disadvantages in the prior art and to specify an electronic component having a semiconductor chip and having a system carrier for the assembly of the electronic component, which system carrier ensures improved thermal contact between flat conductor ends and heat sink and simplifies the assembly and the packaging of the electronic component.

This object is achieved by the features of the independent claims. Advantageous developments of the invention emerge from the dependent claims.

According to the invention, an electronic component having at least one semiconductor chip and having flat conductors, having a heat conduction block belonging to a system carrier and having a housing of a plastic compound is provided, the semiconductor chip having a passive rear side which is mounted on the heat conduction block. Inner flat conductor ends are arranged in an overlapping manner in the region of the heat conduction block, the electronic component having a connecting layer arranged between flat conductor ends and heat conduction block in the region of the overlap of the inner flat conductor ends.

This electronic component has the advantage that no second system carrier is required for the heat conduction block, which serves as a heat sink, since the heat conduction block is fixed directly to the inner flat conductor ends by the connecting layer. The inner flat conductor ends therefore carry the heat conduction block, the distance between heat conduction block and inner flat conductor ends being predefined by the thickness of a few micrometers as a function of the desired voltage resistance of the connecting layer.

The connecting layer acts as electrical insulating layer which, depending on the configuration, can also have adhesive and/or heat-conducting properties. In this case, the connecting layer can be formed as an organoceramic layer.

In one embodiment of the invention, the electronic component has a heat conduction block which to some extent is led to the outside and to some extent forms an outer housing side edge of the electronic component. This embodiment of the invention has the advantage that, on account of the region of the heat conduction block led to the outside, soldering the heat conduction block to a printed circuit board can be monitored by using the forming meniscus of the solder melt, without led-out outer contacts of the heat conduction block being required. A further advantage of this embodiment is that, in the region of the led-out heat conduction block, the inner flat conductor ends can be supported substantially better by the connecting layer, because of the enlarged overlapping area.

In a further embodiment of the invention, the electronic component has a conduction block which, to some extent, is led to the outside and forms at least one individual corner region of the housing of the electronic component. An electronic component of this type has the advantage that, in the led-out corner region, the heat conduction block itself remains visible after the electronic component has been soldered onto a printed circuit board, so that the meniscus of the solder melt can be observed, checked and assessed in this drawn-out corner region of the heat conduction block. In addition to the led-out corner region and/or the led-out side edge region, which permit assessment of the meniscus of the solder melt, outer flat conductors can be applied in the same region.

The electronic component can therefore have a number of outer flat conductors, this number being independent of the number and size of the areas of the heat conduction block that are led out to a housing side edge and/or a corner region of the housing. This embodiment of the invention makes it possible to construct electronic components which use the entire circumference of the electronic component for outer flat conductors to be led out and, nevertheless, permit the forming meniscus of a soldered connection between heat conduction block and printed circuit board to be observed.

In a further embodiment of the invention, the electronic component has outer flat conductors in a region of the heat conduction block which is led to the outside and to some extent forms the housing side edge. This embodiment is associated with the advantage that, in spite of a heat conduction block being led to the outside, the entire housing side edge can be used for the introduction of outer flat conductors.

In a further embodiment of the invention, the electronic component has outer flat conductors in a region of the individual corner region which is led to the outside and belongs to the heat conduction block forming the housing. In this embodiment of the invention, the corner region can also be used for the attachment of outer flat conductors, in which region the heat conduction block is led out visibly and forms one corner of the housing.

A further feature of the invention is that a connecting layer, configured in particular as an organoceramic layer, is arranged between the heat conduction block and the inner flat conductor ends. Because of its high voltage resistance, an organoceramic layer can be designed as an extremely thin insulating layer, the organic component of the layer, before being cured, having an adhesive action which ensures good adhesion of the flat conductor ends to the heat conduction block after curing. In relation to the housing plastic compounds, this layer exhibits a high electrical insulating effect even in a thin embodiment of a few micrometers. Improved heat conduction via this layer is therefore possible. In addition, the improved heat conduction is reinforced by the ceramic component in the layer.

In a further embodiment of the invention, the organoceramic layer has, as ceramic component, at least one of the following oxides of silicon, of aluminum, of titanium or of zirconium. These ceramic components or oxides, as compared with a plastic compound of a housing, have the advantage that they exhibit a higher thermal conductivity.

The organoceramic layer can have, as organic component, at least one polyethylene or polymethylmethacrylate or a polyethyleneoxide. These organic components in the form of polymers have the advantage that they can incorporate ceramic components in the form of oxides during polymerization or during curing and crosslinking, so that an organoceramic material is formed. Organoceramic materials of this type are also known under the trade name "Ormocers".

A further embodiment of the invention provides for the electronic component to have a plastic compound as housing. In this embodiment of the invention, the housing base is to some extent formed by an area of the heat conduction block, namely the underside of the heat conduction block. Furthermore, in this embodiment of the invention, both the housing side edges and housing corners can to some extent be formed from further areas of the heat conduction block. In this embodiment of the invention, outer flat conductors are distributed on the circumference of the housing and project out of the housing side edges. Via these outer flat conductors, electrical currents and voltages can be led from or applied to the semiconductor chip in a manner insulated from the heat conduction block. Furthermore, via the outer flat conductors in this embodiment of the invention, heat can be transmitted to the heat conduction block partly embedded in plastic compound. Improved transferability of heat, which is applied to the outside via the outer flat conductors, is possible if the connecting layer between the inner flat conductor ends and the heat conduction block exhibits an improved thermal conductivity. Therefore, with this embodiment of the invention, it is easily possible for an electronic component which has been soldered onto a printed circuit board to be removed again from the printed circuit board by melting the soldered connection by supplying heat via the outer flat conductors.

In a further embodiment of the invention, the heat conduction block is supported mechanically on the inner flat conductor ends. In such an electronic component, the heat conduction block is carried directly by the inner flat conductor ends, since it is supported by the connecting layer arranged in an overlapping way on the inner flat conductor ends. In this embodiment of the invention, the connecting layer performs a mechanical function and holds a heat conductor block placed on the inner flat conductor ends in its position.

In a further embodiment of the invention, the semiconductor chip has contact areas which are connected electrically via bonding connections to the overlapping flat conductor ends on the heat conduction block. In this case, the flat conductor ends are insulated electrically from the heat conduction block by the connecting layer. In this embodiment of the invention, an electrical path is produced from the outer flat conductors, via the inner flat conductors, the overlapping flat conductor ends of the inner flat conductors, to contact areas on the semiconductor chip, by means of bonding connections. In this embodiment of the invention, in spite of the solid metal core of the heat conduction block, to which the semiconductor chip can be connected electrically on its passive rear side, this electrical path is made available in a manner insulated from this heat conduction block.

A further embodiment of the invention provides for a bevel in the form of a chamfer to be arranged in the edge region of the heat conduction block. This chamfer is covered by the connecting layer and extends the protection of the upper side of the heat conduction block beyond the overlapping region with the inner flat conductors. The interspace between chamfer and inner flat conductors can be filled with plastic compound during the production of the housing. This embodiment of the invention has the advantage of improved voltage resistance, since the distance between heat conduction block and inner flat conductors is enlarged in the edge region and is protected by a combination of plastic compound and connecting layer against voltage flashovers.

A further embodiment of the invention provides for a step or a ledge to be arranged in the edge region of the heat conduction block. This step or the ledge is covered by the connecting layer. With this step, the voltage resistance of the component is improved, and the formation of leakage currents between heat conduction block and inner flat conductors is prevented.

A further aspect of the invention relates to a system carrier having a heat conduction block fixed mechanically on the inner flat conductors via a connecting layer, configured in particular as an organoceramic layer, in order to accommodate a semiconductor chip. In this case, the connecting layer acts as an electrical insulating layer which, depending on the configuration, can also have adhesive and/or heat-conducting properties. A system carrier of this type has a metallic strip which has a structure which has both inner flat conductors and outer flat conductors. In this embodiment of the invention, the system carrier has, on its flat conductor ends of the inner flat conductors, a connecting layer which is used to fix the heat conduction block, this heat conduction block being able to carry a semiconductor chip, which is soldered by its rear side to the heat conduction block or is electrically conductively connected to the heat conduction block by a conductive adhesive.

In this embodiment of the invention, soldering the semiconductor chip to the heat conduction block is readily possible because of the temperature resistance of the connecting layer. Therefore, first of all a system carrier having inner and outer flat conductors, having a connecting layer and having a mechanically fixed heat conduction block can be produced, and only then are the semiconductor chips positioned on the system carrier and also soldered. The advantage is that a permanent mechanical connection between inner flat conductor ends and heat conduction block is produced and, consequently, the attachment of bonding connections to the inner flat conductor ends is made reliably possibly, since the inner flat conductor ends no longer have to float above the heat conduction block in the overlapping region during the bonding operation.

A further embodiment of the invention provides for the inner flat conductor ends to be covered on one side with a plastic compound. On account of fixing the inner flat conductor ends to the heat conduction block by means of a connecting layer, it is no longer necessary for the housing plastic compound to surround the inner flat conductors completely. Instead, in this embodiment of the invention, the flat conductors are still embedded in plastic compound only from above and from the sides, while the undersides of the flat conductors toward the heat conduction block are both insulated and fixed by the connecting layer.

According to the invention, a system carrier is provided which has outer and inner flat conductors. The outer flat conductors are in this case fixed to the system carrier frame, while the inner flat conductors are initially arranged such that they float freely in the direction of the center of the system carrier. However, in the embodiment of this system carrier according to the invention, the inner flat conductor ends are supported mechanically by a heat conduction block, which is overlapped in its edge region by the inner flat conductor ends. In the region of the overlap, the system carrier has a connecting layer between the inner flat conductor ends and the heat conduction block, said layer serving as an insulating layer and, depending on the configuration, also possibly having adhesive and/or heat-conducting properties.

With this embodiment of a system carrier, previously standardized and known system carriers are substantially simplified and their production is made cheaper. Firstly, the structures of inner and outer flat conductors are introduced into the system carrier. The heat conduction block, which can carry a semiconductor chip at the same time, is adhesively bonded to the inner flat conductor ends via the connecting layer. As a result of the adhesive and supportive action of the connecting layer on the inner flat conductor ends, at the same time the bonding between flat conductor ends and contact areas on a chip can be carried out more reliably.

A further embodiment of the invention provides for the system carrier to have a heat conduction block which to some extent forms areas that are led to the outside. These areas to some extent led to the outside form an outer housing side edge and/or an individual corner region of the electronic component. A system carrier of this type has the advantage that, by using it, electronic components can be produced which can be soldered onto a printed circuit board while being monitored by observing a meniscus.

In a further embodiment of the invention, the system carrier has a number of outer flat conductors. This number is independent of the number and the size of the areas of the heat conduction block that are led out to a housing side edge and/or a corner region. The system carrier can therefore have outer flat conductors, even in the region of the led-out areas of the heat conduction block, this being associated with the advantage that an increased number of flat conductors can be distributed uniformly on the circumference of the housing.

In a further embodiment of the invention, the system carrier has outer flat conductors in a region of the heat conduction block that is led to the outside. This region of the heat conduction block to some extent forms the housing side edge and/or an individual corner region of an electronic component. This embodiment is associated with the advantage that the entire circumference of an electronic component can be provided with outer flat conductors if this system carrier is used.

In a further embodiment of the invention, the organoceramic layer of the system carrier has, as ceramic component, at least one of the following oxides of silicon, of aluminum, of titanium or of zirconium. As compared with plastic compounds, these ceramic components have the advantage of improved heat conduction. The connecting layer of the system carrier, formed as an organoceramic layer, can also have, as organic component, at least one polyethylene or one polymethyl methacrylate. These organic components impart an adhesive action to the organoceramic layer in the uncured state and high adhesion to the surfaces of the inner flat conductor ends and the heat conduction block in the cured state.

In a further embodiment of the invention, the heat conduction block of the system carrier to some extent forms a housing base, while a further area of the heat conduction block to some extent forms a housing side edge and/or a housing corner. At the same time, outer flat conductors are distributed uniformly on the circumference of the housing in this embodiment of the invention. This embodiment therefore has the advantage that the number of outer flat conductors of a housing does not depend on the shape of the heat conduction block, instead the entire circumference of the housing can be used for the outer flat conductors projecting from the housing in the system carrier according to the invention.

Furthermore, provision is made for the heat conduction block of the system carrier to be arranged such that it is supported mechanically on the inner flat conductor ends. This embodiment of the system carrier according to the invention has the advantage that, because of the connecting layer, the inner flat conductor ends are capable of supporting the heat conduction block directly or of accommodating a heat conduction block fixed at the center of the system carrier, without a second system carrier being required for the production of the heat conduction block.

In a further embodiment of the present invention, provision is made for a heat conduction block of the system carrier fixed mechanically to the inner flat conductor ends by a connecting layer to be dimensioned to accommodate a semiconductor chip. With this dimensioning, the heat conduction block is arranged at the center of the system carrier and its upper side is kept free of inner flat conductors or flat conductor ends in the region in which a semiconductor chip can be positioned. To the extent that they overlap the heat conduction block, the flat conductor ends surround the semiconductor chip in the immediate vicinity of the latter. Because of their fixing to the heat conduction block via a connecting layer arranged between, bonding connections between the contact areas arranged at the edge of the semiconductor chip and the inner flat conductor ends can be produced in a secured manner. For this purpose, the flat conductor ends can be coated by means of a bondable metal compound.

A method of producing a system carrier having outer and inner flat conductors and having a heat conduction block arranged on the inner flat conductor ends has the following method steps:

providing a system carrier having outer and inner flat conductors, the inner flat conductors having flat conductor ends, providing a heat conduction block which is dimensioned in such a way that its upper side overlaps the inner flat conductor ends, coating the inner flat conductor ends or the heat conduction block with a curable, electrically insulating connecting layer, formed in particular as an organoceramic layer, applying the heat conduction block in an overlapping manner to the inner flat conductor ends, so that the connecting layer is arranged between them, curing the connecting layer.

This method has the advantage that only a few method steps are required to produce such a system carrier. In principle, a heat conduction block merely has to be applied additionally to the inner flat conductor ends of a system carrier via a curable connecting layer and, during the subsequent assembly to form an electronic component, can carry a semiconductor chip. The system carrier can therefore be configured as a system carrier strip, in which first of all individual system carrier positions without a heat conduction block are structured. In a further step, following the coating of the inner flat conductor ends of the system carrier strip with a curable connecting layer, the heat conduction block is applied, overlapping the inner flat conductor ends. As a result of curing the connecting layer, stable mechanical connection is produced between heat conduction block and inner flat conductor ends, so that this system carrier is particularly suitable for power components which can dissipate their heat losses to the outside via a heat conduction block.

A method of producing an electronic component having a semiconductor chip which is mounted with its passive rear side on a heat conduction block has the following method steps:

providing a system carrier having outer and inner flat conductors, the inner flat conductors having flat conductor ends, providing a heat conduction block whose upper side is larger than the passive rear side of the semiconductor chip, coating the inner flat conductor ends or the heat conduction block with a curable, electrically insulating connecting layer, formed in particular as an organoceramic layer, applying the heat conduction block in an overlapping manner to the inner flat conductor ends, so that the connecting layer is arranged between them, curing the connecting layer, applying a semiconductor chip to the upper side of the heat conduction block, electrically connecting contact areas on the semiconductor chip to the inner flat conductor ends, packaging the semiconductor chip with heat conduction block and inner flat conductor ends in a plastic compound as housing, areas of the heat conduction block to some extent forming a housing base and to some extent forming a housing side edge and/or a housing corner.

This method has the advantage that electronic components can be produced which have a semiconductor chip which is arranged directly on a heat conduction block, and for which stable bonding connections can be produced by arranging the inner flat conductor ends on the heat conduction block over a connecting layer. In addition, this method has the advantage that the heat conduction block does not have to be surrounded completely by a plastic housing compound, and also to some extent side edges or individual corner regions of the housing can be occupied by areas of the heat conduction block without the number of outer flat conductors having to be reduced in order to lead areas of the heat conduction block laterally out at the housing side edge.

In the method according to the invention, other curable materials which are electrically insulating can also be conceived for the connecting layer. In this case, depending on the application, it is possible to tolerate a reduced thermal conductivity or reduced adhesive capability as compared with organoceramic layers.

In order to accommodate large heat sinks in relatively small housings, it is also conceivable to arrange the lead fingers or inner flat conductor ends to overlap the heat sink or heat conduction block. In the case of small chips, such a construction permits shorter wire connections or bonding connections, which is associated with a lower nonreactive resistance, a lower inductance and higher robustness against wire sweep during molding, that is to say shifting of the wires during injection molding of the plastic compound. However, in such a solution, the process engineering outlay during wiring bonding is considerably increased. This leads to an increased yield risk, since during bonding the freely floating inner flat conductor ends spring back and, in the process, an impermissible stress or impermissible stresses are exerted on the bonding wire or on the wire connection. In the case of this form of floating inner flat conductor ends, the plastic compound of the housing insulates the flat conductors from the heat conduction block. The invention avoids this.

In principle, there is also the possibility of fixing the overlapping leads or inner flat conductor ends to the heat conduction block via a thermoplastic film. Since the heat sink or heat conduction block is normally mounted before the die-attachment or the fitting of the semiconductor chip to the lead frame or the system carrier, the temperature limitation arising from the thermoplastic film does not permit a soft solder connection between semiconductor chip and heat sink or heat conduction block. Furthermore, the polymer adhesive bond via a thermoplastic film between semiconductor chip and heat conduction block possesses poorer thermal properties than a soft solder connection.

A further aspect of the invention is to support the floating inner flat conductor ends by means of a connecting layer which, for its part, is highly insulating and can be designed to be extremely thin. Furthermore, following its curing, the connecting layer constitutes a high-temperature resistant adhesive, so that the semiconductor chip can be soft soldered to the heat conduction block, which means that the thermal conductivity between semiconductor chip and heat conduction block is improved considerably as compared with polymeric conductive adhesives. Furthermore, this thin highly insulating connecting layer constitutes a relatively small thermal resistance, so that in the event of a repair, the necessary heat energy can be introduced by heating the outer flat conductors, in order to remove from the printed circuit board the heat conduction block soldered to the printed circuit board. In addition, on account of the device according to the invention, it is possible to dispense with floating short inner flat conductor ends, so that to some extent in predetermined regions, the entire inner flat conductors can overlap the heat conduction block and the heat conduction block itself can to some extent reach as far as the housing side edge, in order to be able to observe or check the wetting meniscus. Organoceramic compounds in particular are good adhesion promotors to plastic pressing compounds for the housing, so that additional mechanical anchoring means can be reduced.

BRIEF DESCRIPTION OF THE DRAWING

The invention will now be explained in more detail using exemplary embodiments and with reference to the appended figures, in which.

DESCRIPTION OF THE PREFERRED EMBODIMENTS

Figure 1:
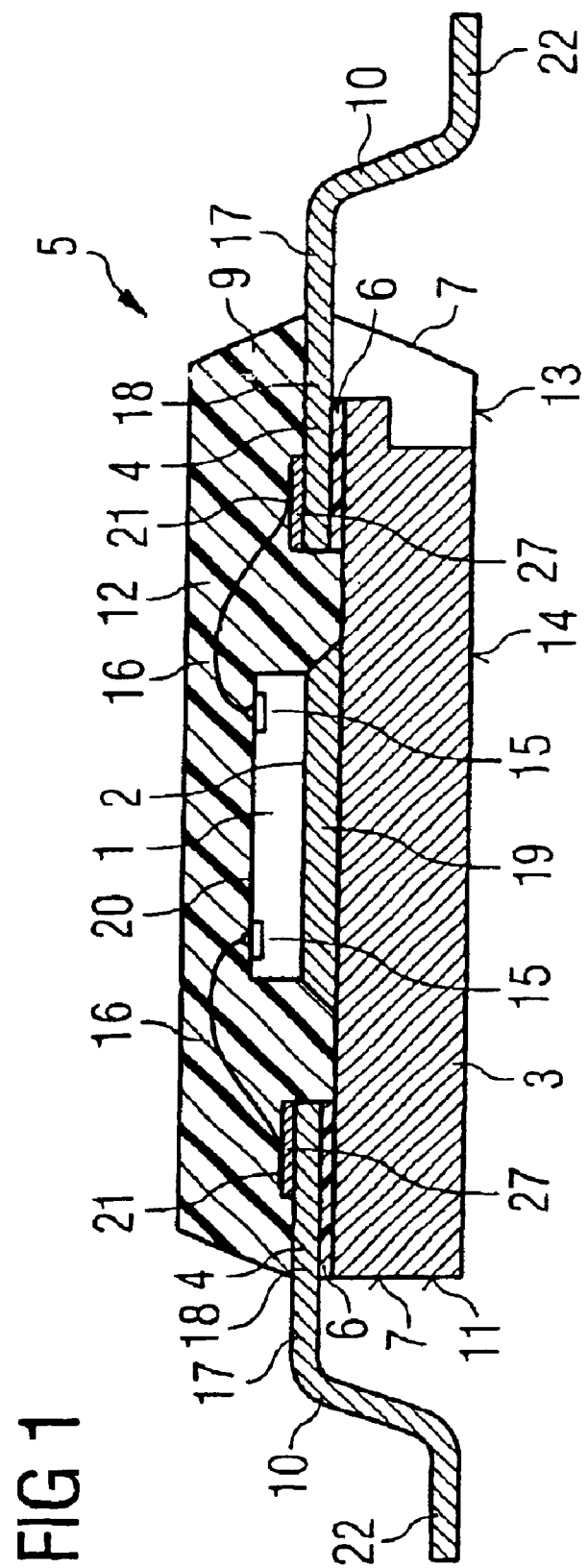
FIG. 1 shows a schematic cross-sectional view through an electronic component according to a first embodiment of the invention.

FIG. 1 shows a schematic cross-sectional view through an electronic component 5 according to one embodiment of the invention. The electronic component 5 has at its center a semiconductor chip 1 which is fixed with its passive rear side 2 on a heat conduction block 3. To improve the transfer of heat between the semiconductor chip 1 and heat conduction block 3, the semiconductor chip 1 is arranged on the heat conduction block 3 with a soft solder layer 19 as a thermal bridge.

The electronic component 5 is a power component whose semiconductor chip 1 has contact areas 15 in its edge region on its active upper side 20. The contact areas 15 are arranged above bonding connections 16 with contact connection areas 21 on flat conductor ends 4 of inner flat conductors 18. For this purpose, the inner flat conductor ends 4 have a bondable coating 27 in the region of the contact connection areas 21. The inner flat conductor ends 4 are arranged in an overlapping manner on the heat conduction block 3 and are electrically insulated from and thermally conductively connected to the latter by means of a connecting layer formed as a high-temperature resistant organoceramic layer 6. Because of the high-temperature resistant connection between the heat conduction block 3 and the flat conductor ends 4, it is possible to apply the semiconductor chip 1 to the heat conduction block 3 by means of a soldering process. It is also ensured that the bonding connection 16 can be applied reliably and is not displaced during the fitting of the housing 9 of a plastic compound.

From the housing 9 there project outer flat conductors 10, which are bent over, so that outer flat conductor ends 22 are at the same level as the housing base 13. The housing base 13 is to some extent formed by the underside 14 of the heat conduction block 3. One side area 11 of the heat conduction block 3 is led out as far as the edge of the housing 9 and, in this region of the led-out area 11 of the heat conduction block 3, to some extent forms a housing outer edge 2 on the left-hand side of FIG. 1, while on the right-hand side of FIG. 1 the housing side 7 is formed by the plastic compound 12 of the housing 9. This led-out area 11 of the heat conduction block 3 has the advantage that during the soldering of the heat conduction block 3 to a printed circuit board, not shown, the forming meniscus of the solder melt can be observed there, since the heat conduction block 3 is easily visible at this location for testing and monitoring the meniscus.

On account of fixing the outer and inner region of a flat conductor via the organoceramic connection, it is possible to make available for outer flat conductors 10 even those areas of a housing at which checking of the solder meniscus is made possible.

Figure 2:
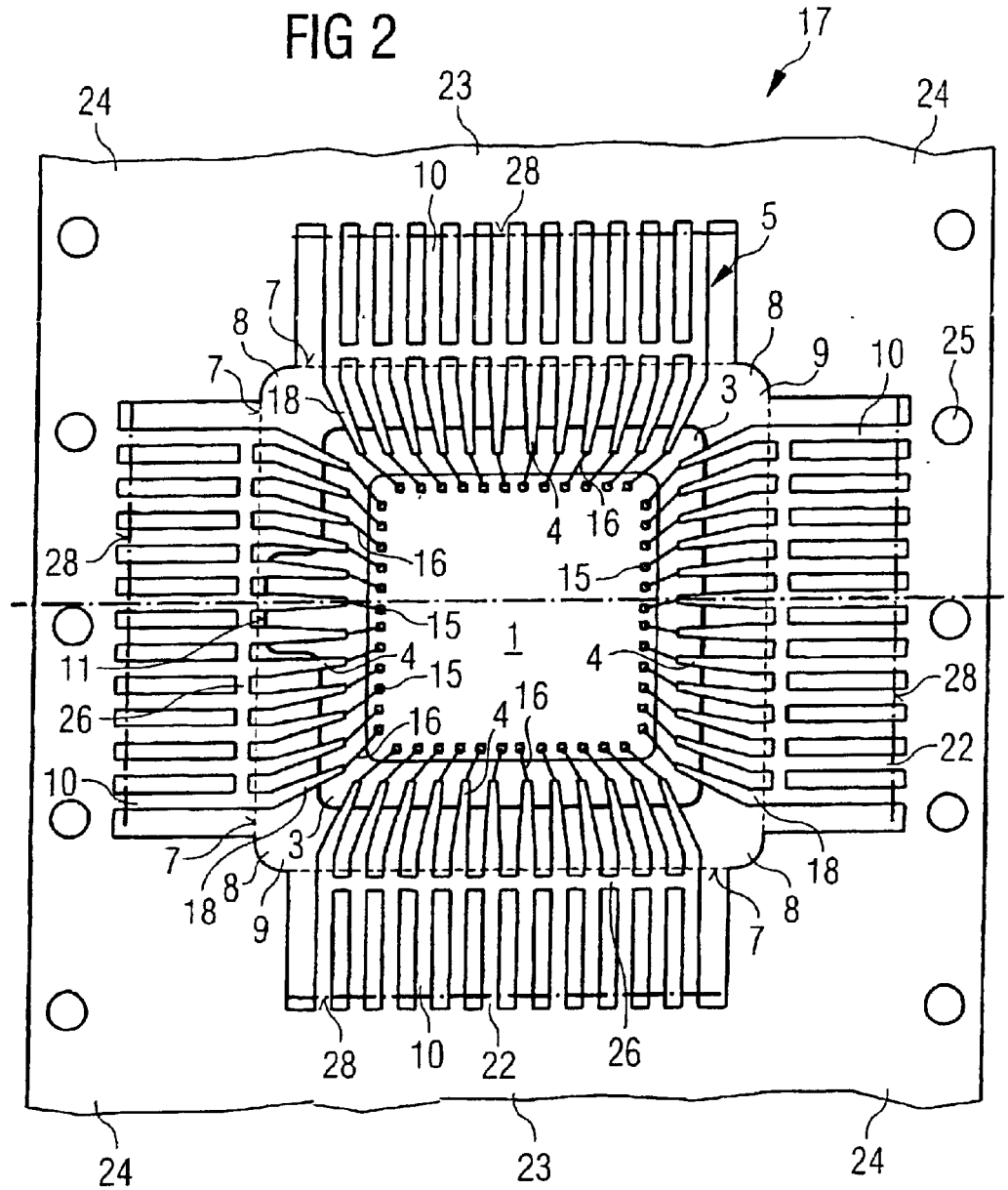
FIG. 2 shows a schematic plan view of a system carrier having a mounted heat conduction block and a semiconductor chip arranged thereon for the production of an electronic component according to FIG. 1.

FIG. 2 shows a schematic plan view of a system carrier 17 having a mounted heat conduction block 3 and a semiconductor chip 1 arranged thereon for the production of an electronic component 5 according to FIG. 1. Components with the same functions as in FIG. 1 are identified by the same designations and not specifically explained. The system carrier 17 is part of a system carrier strip 23 which has a perforation in its edge regions 24. The perforation openings 25 are used for the transport and fixing of the system carrier strip in the individual production processes.

The detail of a system carrier strip 23 depicted in FIG. 2 shows a system carrier 17 which has a structure of outer flat conductors 10 and inner flat conductors 18. At their flat conductor ends 4, the inner flat conductors 18 have bonding connections 16, which connect the flat conductors electrically to contact areas 15 of the semiconductor chip 1 arranged at the center of the system carrier 17. A peripheral dashed line shows the housing side edge 7 to be formed of a plastic housing which is to be formed and which embeds the inner flat conductors 18 and the bonding connections 16, the semiconductor chip 1 and the heat conduction block 3 arranged underneath the semiconductor chip 1 and underneath the flat conductor ends 4 in a plastic compound. The heat conduction block 3 is mechanically connected and held on the system carrier 17 by a connecting layer which is formed as an organoceramic layer and which is arranged between the inner flat conductor ends 4 and the upper side of the heat conduction block 3. This heat conduction block 3 has a thickness between 0.6 and 1.3 mm.

One side area 11 of the heat conduction block 3 is led out as far as the housing side edge 7, so then when the electronic component 5 is soldered to a printed circuit board, not shown, the formation of a solder-melt meniscus can be observed and checked. In spite of this area 11 of the heat conduction block 3 being led out laterally, this side of the electronic component 5 is occupied continuously and uniformly by flat conductors 10, 18, which project from the housing 9. In this way, dense packing of flat conductors 10, 18 can be achieved even in the case in which individual areas of the heat conduction block 3 are led out as far as the housing side edge 7. Following the application of the plastic housing, not shown here, the mechanical bridges 26 between the outer flat conductors 10 can be punched out, and the outer flat conductor ends 22 can be severed from the system carrier strip 23 along the dash-dotted lines 28. After the finally packaged electronic component has been severed from the system carrier 17, the outer flat conductors 10 can be bent in the manner as shown in FIG. 1.

Figure 3:
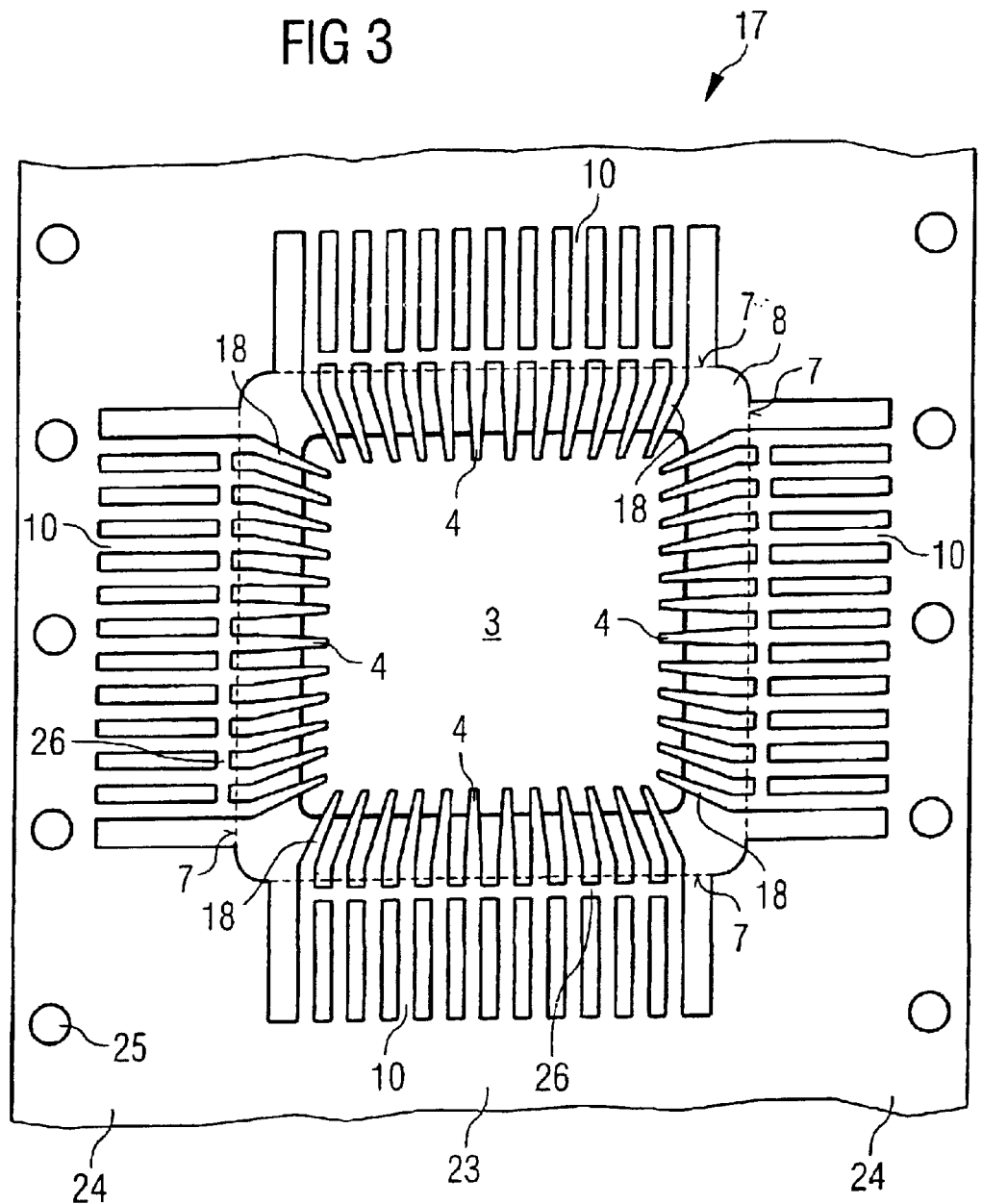
FIG. 3 shows a schematic plan view of a system carrier having a heat conduction block according to a second embodiment of the invention.

FIG. 3 shows a schematic plan view of a system carrier 17 having a heat conduction block 3 according to a second embodiment of the invention. Components with the same functions as in the preceding figures are identified by the same designations and not specifically explained.

The significant difference of the system carrier 17 as compared with the first embodiment of the invention as illustrated in FIGS. 1 and 2 is that the heat conduction block 3 is arranged completely inside the dashed line of the housing side edge 7 and does not have any-areas leading to the outside.

Figure 4:
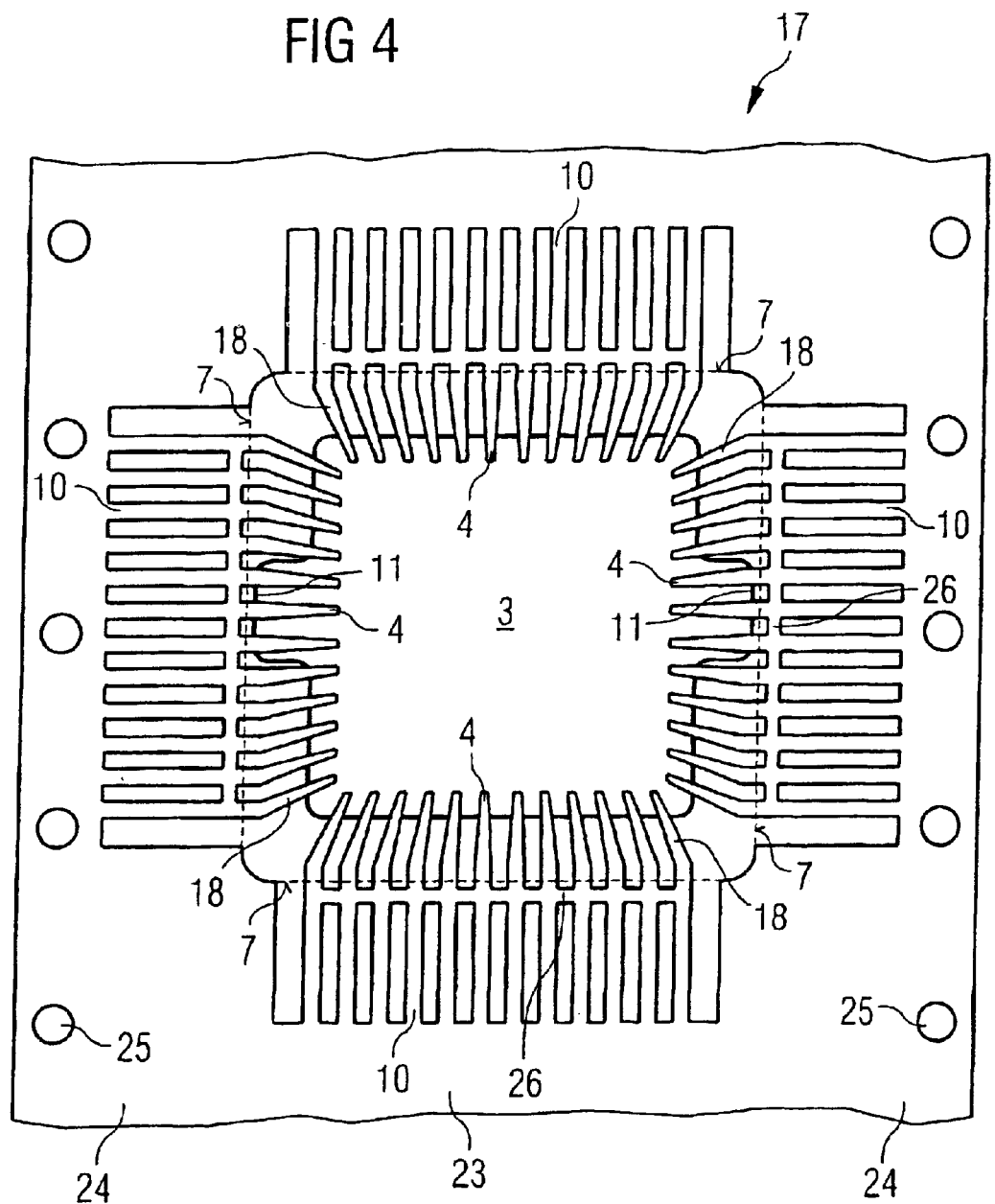
FIG. 4 shows a schematic plan view of a system carrier having a heat conduction block according to a third embodiment of the invention.

FIG. 4 shows a schematic plan view of a system carrier 17 having a heat conduction block 3 according to a third embodiment of the invention. Components with the same functions as in the preceding figures are identified by the same designations and not specifically explained.

A significant difference of the third embodiment in relation to the second and third embodiment of the invention resides in the fact that two areas 11 of the heat conduction block 3 are led out as far as the housing side edge 7 of the housing, and therefore improved monitoring of the meniscus of the soft solder layer is made possible. In addition, this embodiment of the invention provides for inner flat conductor ends 4 to be distributed uniformly on the circumference of the heat conduction block 3. The flat conductor ends 4 of the inner flat conductors 18 are not suspended in a floating manner in this embodiment, but are connected to the heat conduction block 3 via a connecting layer formed as an organoceramic layer.

Figure 5:
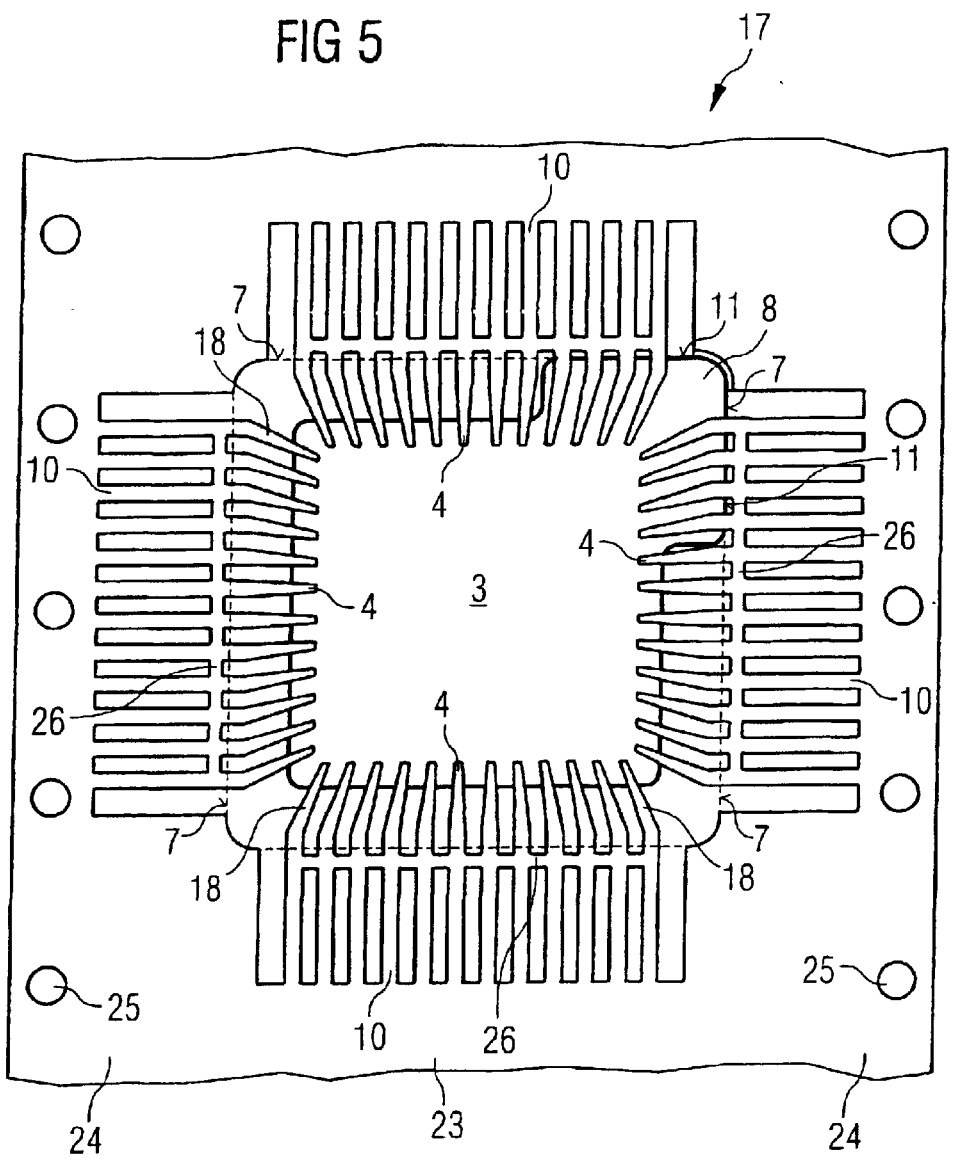
FIG. 5 shows a schematic plan view of a system carrier having a heat conduction block according to a fourth embodiment of the invention.

FIG. 5 shows a schematic plan view of a system carrier 17 having a heat conduction block 3 according to a fourth embodiment of the invention. Components with the same functions as in the preceding figures are identified by the same designations and not specifically explained.

The fourth embodiment of the invention differs from the preceding embodiments of the invention in that the heat conduction block 3 has areas led out in a corner region 8 of the housing 9. This corner region 8 with its areas 11 of the heat conduction block 3 led out has the same function as the areas 11 of the heat conduction block 3 led out on the edge sides in FIGS. 1 and 4. They are used substantially for monitoring and observing the solder melt in the edge region of the housing, after the electronic component with the system carrier 17 has been soldered onto a printed circuit board, not shown.

Figure 6:
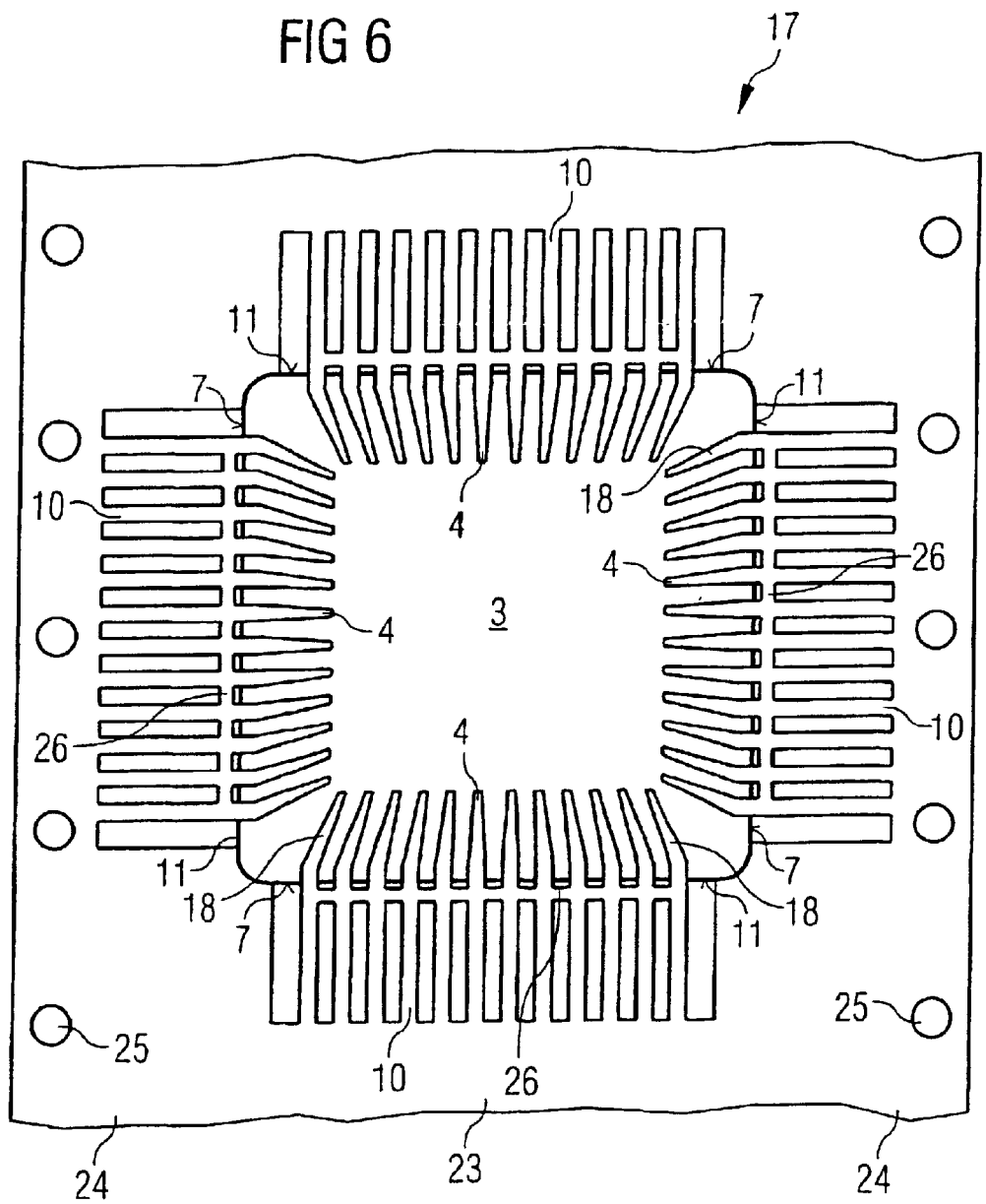
FIG. 6 shows a schematic plan view of a system carrier having a heat conduction block according to a fifth embodiment of the invention.

FIG. 6 shows a plan view of a system carrier 17 having a heat conduction block 3 according to a fifth embodiment of the invention. Components with the same functions as in the preceding figures are identified by the same designations and not specifically explained.

In this embodiment of the invention, the outer areas of the heat conduction block 3 at the same time form the housing side edge 7 of the electronic component in the lower housing region of the electronic component, while the upper half of the housing of the electronic component is formed by a plastic compound, so that the inner flat conductors 18 are embedded from the top in the plastic compound only on one side.

Figure 7:
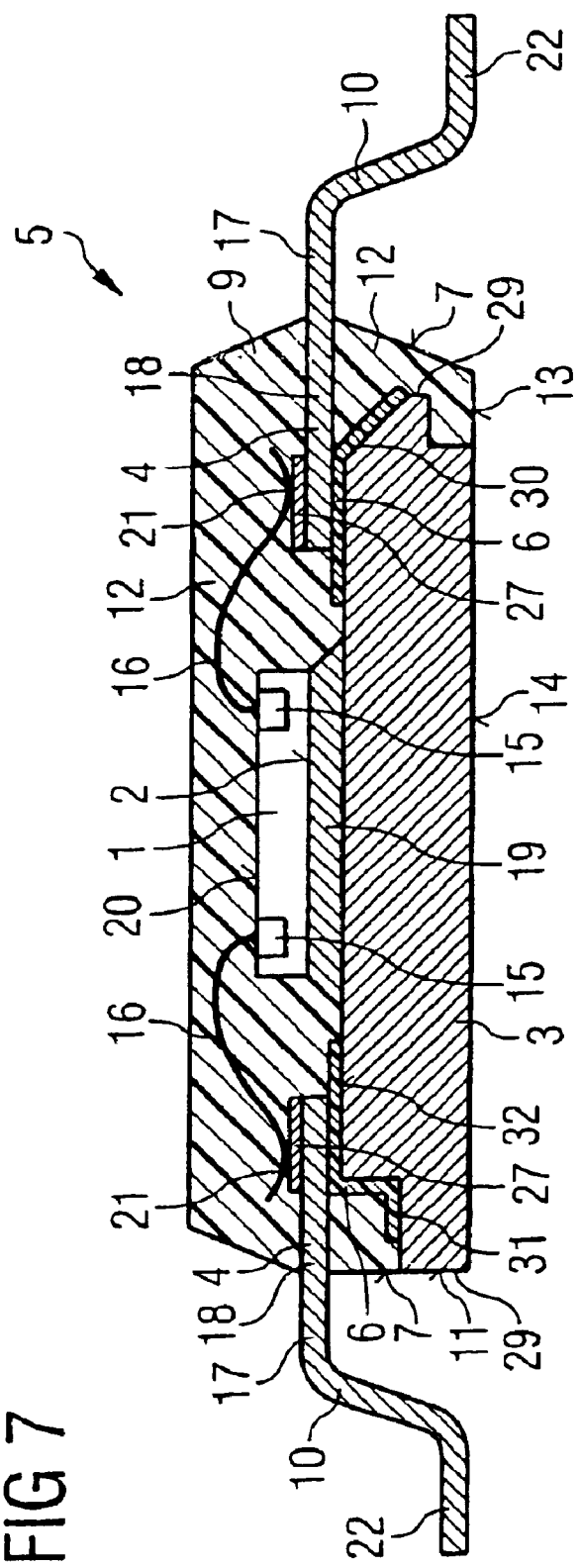
FIG. 7 shows a schematic cross-sectional view of an electronic component according to a sixth embodiment of the invention.

FIG. 7 shows a schematic cross-sectional view of an electronic component 5 according to a sixth embodiment of the invention. Components with the same functions as in the preceding figures are identified by the same designations and not specifically explained.

The sixth embodiment of the invention differs from the first embodiment of the invention from FIG. 1 in that the heat conduction block 3 has, in the edge region 29 of its upper side 32, a chamfer 30, which is covered by the connecting layer formed as an organoceramic layer 6 and which extends over a larger surface region of the heat conduction block 3 than the overlapping region of the inner flat conductors 18. With this embodiment, the voltage resistance of the component 5 is increased, since overvoltages cannot lead to flashovers or short circuits at the edge sides of the heat conduction block. In addition, leakage currents between heat conduction block 3 and inner flat conductors 8 are prevented, since the organoceramic layer 6 covers a greater area than the overlapping region of the inner flat conductors 18.

While, in the right-hand half of the figure, a chamfer 30 is arranged in the edge region 29 of the heat conduction block 3, the left-hand half of the FIG. 7 has a step 31 on the heat conduction block 3, said step being covered by the organoceramic layer 6. The action of this step 31 corresponds to the action of the chamfer 30 and improves the voltage resistance of the electronic component 5 and prevents leakage currents between heat conduction block 3 and inner flat conductors 18.

In an exemplary embodiment which is not shown here, other curable materials which are electrically insulating can also be conceived for the connecting layer. In this case, depending on the application, it is also possible to tolerate a reduced thermal conductivity or reduced adhesive capability as compared with organoceramic layers.

List of designations
1 Semiconductor chip
2 Passive rear side
3 Heat conduction block
4 Flat conductor ends
5 Electronic component
6 Organoceramic layer
7 Housing side edge
8 Corner region
9 Housing
10 Outer flat conductor
11 Led-out areas of the heat conduction block
12 Plastic compound
13 Housing base
14 Underside of the heat block as housing base
15 Contact areas
16 Bonding connections
17 System carrier
18 Inner flat conductor
19 Soft solder layer
20 Active upper side of the semiconductor chip
21 Contact connection areas
22 Outer flat conductor ends
23 System carrier strip
24 Edge region of the system carrier strip
25 Perforation openings
26 Bridges between the outer flat conductors
27 Bondable coating
28 Dash-dotted line for punching out the electronic component
29 Edge region of the heat conduction block
30 Chamfer
31 Step or ledge
32 Upper side of the heat conduction block.

What is claimed is:
1. An electronic component, comprising:
a heat conduction block having a housing made of a plastic compound;
a semiconductor chip, having a passive rear side mounted on said heat conduction block;
flat conductors having flat conductor ends disposed on and overlapping a region of said heat conduction block;

and an organoceramic layer disposed between said flat conductor ends and said heat conduction block in said region;

said organoceramic layer having a ceramic component selected from the group consisting of an oxide of silicon, an oxide of aluminum, an oxide of titanium, and an oxide of zirconium, and an organic component selected from the group consisting of a polyethylene, a polymethyl methacrylate, and a polyethylene oxide;

said organoceramic layer insulating, mutually adhering, and conducting heat between said flat conductor ends and said heat conduction block.

2. The electronic component according to claim 1, wherein:

said housing has an outer housing side edge; and said heat conduction block is led at least partially outside said housing to form at least part of said outer housing side edge.

3. The electronic component according to claim 1, wherein:

said housing has an individual corner region; and said heat conduction block is led at least partially outside said housing to form at least part of said individual corner region.

4. The electronic component according to claim 1, wherein:

said housing has a corner region;

said heat conduction block has a number of areas with a given size led out to said housing side edge; and a number of outer flat conductors is independent of the number and the size of said areas.

5. The electronic component according to claim 1, wherein:

said housing has a corner region;

said heat conduction block has a number of areas with a given size led out to said corner region of said housing; and a number of outer flat conductors is independent of the number and the size of said areas.

6. The electronic component according to claim 3, wherein:

said housing has an outer edge;

said heat conduction block has a region that is led outside and at least partly forms said outer edge of said housing; and outer flat conductors are disposed in said region.

7. The electronic component according to claim 4, wherein:

said housing has an outer edge;

said heat conduction block has a region that is led outside and at least partly forms said outer edge of said housing; and said outer flat conductors are disposed in said region.

8. The electronic component according to claim 5, wherein:

said housing has an outer edge;

said heat conduction block has a region that is led outside and at least partly forms said outer edge of said housing; and said outer flat conductors are disposed in said region.

9. The electronic component according to claim 3, wherein said individual corner region defines a further region of said heat conduction block; and outer flat conductors are disposed in said further region defined by said individual corner region.

10. The electronic component according to claim 1, wherein:

said heat conduction block defines an area;

said housing is a plastic compound and includes a housing base; said housing base forming a portion of said area of said heat conduction block;

at least one of housing side edges and housing corners forming a further portion of said heat conduction block; and outer flat conductors are distributed circumferentially about and projected from said housing side edges, said outer flat conductors being electrically connected to said semiconductor chip, insulated from said heat conduction block, and thermally connected to said heat conduction block in order to transfer heat to said heat conduction block.

11. The electronic component according to claim 1, wherein said heat conduction block is supported mechanically on said inner flat conductor ends.

12. The electronic component according to claim 1, wherein:

said semiconductor chip has contact areas;

bonding connections connect electrically said contact areas to said overlapping flat conductor ends on said heat conduction block; and said organoceramic layer electrically insulates said flat conductor ends from said heat conduction block.

13. The electronic component according to claim 1, wherein:

said inner flat conductor ends have a side; and a plastic compound covers said one side of said inner flat conductor ends.

14. The electronic component according to claim 1, wherein said heat conduction block has an edge region with a chamfer formed therein; and a further organoceramic layer covering said chamfer and projecting beyond said region where said inner flat conductors overlap said heat conduction block.

15. The electronic component according to claim 14, wherein said chamfer in said edge region is shaped like a step.

16. A system carrier comprising:

outer and inner flat conductors having flat conductor ends;

a heat conduction block having a region overlapping said flat conductor ends and disposed on said flat conductor ends of said inner flat conductors in order to accommodate a semiconductor chip; and an organoceramic layer disposed between said flat conductor ends of said inner flat conductors and said region of said heat conduction block;

said organoceramic layer having a ceramic component selected from the group consisting of an oxide of silicon, an oxide of aluminum, an oxide of titanium, and an oxide of zirconium, and an organic component selected from the group consisting of a polyethylene, a polymethyl methacrylate, and a polyethylene oxide;

said organoceramic layer insulating, mutually adhering, and conducting heat between said conductor ends of said inner flat conductors and said heat conduction block.

17. The system carrier according to claim 16, further comprising a housing having an exterior; said heat conduction block having areas led to said exterior of said housing, said areas at least partially forming at least one of an outer housing side edge and an individual corner region.

18. The system carrier according to claim 17, further comprising:
   a number of outer flat conductors; and
   a number of said areas, said areas having a given size; said number of said outer flat conductors being independently selected from said number and said size of said areas.

19. The system carrier according to claim 16, further comprising a housing; and
   said heat conduction block having a region leading outside said housing and at least partly forming at least one of a housing side edge of said housing and an individual corner region; and
   said outer flat conductors being disposed in said region of said heat conduction block.

20. The system carrier according to claim 16, wherein:
   a first area of said heat conduction block at least partly forms a housing base;
   a second area of said heat conduction block at least partly forms at least one of a housing side edge and a housing corner; and
   said outer flat conductors are circumferentially distributed.

21. The system carrier according to claim 16, wherein said heat conduction block is supported mechanically on said flat conductor ends of said inner flat conductors.

22. The system carrier according to claim 16, further comprising a further organoceramic layer mechanically fixing said heat conduction block to said flat conductor ends of said inner flat conductors and dimensioned to accommodate the semiconductor chip.

* * * * *